United States Patent
Zhang et al.

(10) Patent No.: US 6,887,786 B2
(45) Date of Patent: May 3, 2005

(54) METHOD AND APPARATUS FOR FORMING A BARRIER LAYER ON A SUBSTRATE

(75) Inventors: Hong Zhang, Fremont, CA (US); Xianmin Tang, San Jose, CA (US); Praburam Gopalraja, San Jose, CA (US); John C. Forster, San Francisco, CA (US); Jick M. Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/409,406

(22) Filed: Apr. 7, 2003

(65) Prior Publication Data

US 2003/0216037 A1 Nov. 20, 2003

Related U.S. Application Data

(60) Provisional application No. 60/430,267, filed on Dec. 2, 2002, provisional application No. 60/380,385, filed on May 14, 2002, and provisional application No. 60/380,386, filed on May 14, 2002.

(51) Int. Cl.⁷ .......................................... H01L 21/4763
(52) U.S. Cl. ................... 438/643; 438/644; 438/648; 438/637; 438/653; 438/656; 438/685
(58) Field of Search ............................... 438/627–629, 438/643–644, 648, 653–654, 656, 678, 685

(56) References Cited

U.S. PATENT DOCUMENTS

| | | |
|---|---|---|
| 6,130,156 A | 10/2000 | Havemann et al. |
| 6,139,697 A | 10/2000 | Chen et al. |
| 6,150,272 A | 11/2000 | Liu et al. |
| 6,217,721 B1 * | 4/2001 | Xu et al. ................ 204/192.17 |
| 6,258,707 B1 | 7/2001 | Uzoh |
| 6,284,657 B1 | 9/2001 | Chooi et al. |
| 6,326,306 B1 | 12/2001 | Lin |
| 6,339,029 B1 | 1/2002 | Yu et al. |
| 6,342,448 B1 | 1/2002 | Lin et al. |
| 6,344,691 B1 | 2/2002 | Iacoponi et al. |
| 6,380,075 B1 | 4/2002 | Cabral, Jr. et al. |
| 6,395,632 B1 | 5/2002 | Farrar |
| 6,531,390 B2 * | 3/2003 | Chooi et al. ................. 438/637 |
| 6,607,977 B1 | 8/2003 | Rozbicki et al. |
| 6,642,146 B1 * | 11/2003 | Rozbicki et al. ............. 438/687 |
| 2002/0041028 A1 | 4/2002 | Choi et al. |
| 2002/0058409 A1 | 5/2002 | Lin et al. |

* cited by examiner

Primary Examiner—Thanh Nguyen
(74) Attorney, Agent, or Firm—Dugan & Dugan

(57) ABSTRACT

A first method is provided for forming a barrier layer on a substrate by sputter-depositing a tantalum nitride layer on a substrate having (1) a metal feature formed on the substrate; (2) a dielectric layer formed over the metal feature; and (3) a via formed in the dielectric layer so as to expose the metal feature. The via has side walls and a bottom, and a width of about 0.18 microns or less. The tantalum nitride layer is deposited on the side walls and bottom of the via and on a field region of the dielectric layer; and has a thickness of at least about 200 angstroms on the field region. The first method also includes sputter-depositing a tantalum layer on the substrate, in the same chamber. The tantalum layer having a thickness of less than about 100 angstroms on the field region. Other aspects are provided.

20 Claims, 8 Drawing Sheets

METHOD AND APPARATUS FOR FORMING A BARRIER LAYER ON A SUBSTRATE

CROSS REFERENCE TO RELATED APPLICATIONS

The present application claims priority from U.S. Provisional Patent Application Ser. No. 60/430,267, filed Dec. 2, 2002 and titled "Method and Apparatus for Sputter Deposition", which is related to U.S. Provisional Patent Application Ser. Nos. 60/380,385 and 60/380,386, both filed on May 14, 2002 and titled "Method and Apparatus for Sputter Deposition". All three of these provisional applications are hereby incorporated by reference herein in their entirety.

FIELD OF THE INVENTION

The present invention is concerned with fabrication of semiconductor devices, and is more particularly concerned with sputtering of materials onto substrates used to fabricate semiconductor devices.

BACKGROUND OF THE INVENTION

Semiconductor device fabrication typically involves depositing and patterning a number of layers on a substrate such as a silicon wafer or glass plate. One widely used method of forming material layers on substrates is known as sputtering or sputter deposition (also referred to as physical vapor deposition (PVD)).

A first conventional PVD reactor is schematically illustrated in cross-section in FIG. 1A. The reactor 10 is of a type sometimes referred to as an SIP (self ionizing plasma) chamber. Reference numeral 10 generally indicates the PVD reactor. The reactor 10 includes a sealable chamber 12, and a target 14 installed at the top of the chamber 12. The target 14 is composed of a material, usually a metal, to be sputter deposited on a wafer 16 held on a pedestal 18. A shield 20 installed within the chamber 12 protects walls of the chamber 12 from material sputtered from the target 14 and provides a grounding anode. A variable (DC) power supply 22 is connected to the target 14 for supplying power thereto.

A working gas supply 23, which includes a working gas source 24 and a first mass flow controller 26, supplies a working gas (typically the chemically inactive gas argon) to the chamber 12. If reactive sputtering is to be performed to sputter-deposit a metal nitride layer, such as TaN, a second gas supply 25 may be provided, including a nitrogen gas source 27 and a second mass flow controller 29. The chamber 12 is shown as receiving argon and nitrogen near the top of the chamber 12, but may be reconfigured to receive argon and nitrogen at other locations, such as near the bottom of the chamber 12. A pump 28 is provided to pump out the chamber 12 to a pressure at which sputtering is performed; and an RF power source 32 is connected to the pedestal 18 through a coupling capacitor 34 (e.g., for biasing the wafer 16 during sputtering).

A controller 30 is provided to control operation of the reactor 10. The controller 30 is operatively connected to control the DC power supply 22, the first mass flow controller 26, the second mass flow controller 29, the pump 28, and the RF power supply 32. The controller 30 similarly may be coupled to control the position and/or temperature of the pedestal 18. For example, the controller 30 may control the distance between the pedestal 18 and the target 14, as well as heating and/or cooling of the pedestal 18. To promote efficient sputtering, a magnetron 36 may be rotationally mounted above the target 14 to shape the plasma. The magnetron 36 may be of a type which produces an asymmetric magnetic field which extends deep into the chamber 12 (e.g., toward the pedestal 18), to enhance the ionization density of the plasma, as disclosed in U.S. Pat. No. 6,183,614. U.S. Pat. No. 6,183,614 is hereby incorporated by reference herein in its entirety. Typical ionized metal densities may reach $10^{10}$ to $10^{11}$ metal ions/cm$^3$ when such asymmetric magnetic fields are employed. In such systems, ionized metal atoms follow the magnetic field lines which extend into the chamber 12, and thus coat the wafer 16 with greater directionality and efficiency. The magnetron 36 may rotate, for example, at 60–100 rpm. Stationary magnetic rings may be used instead of the rotating magnetron 36.

In operation, argon is admitted into the chamber 12 from the working gas supply 23 and the DC power supply 22 is turned on to ignite the argon into a plasma. Positive argon ions thereby are generated, and the target 14 is biased negatively relative to the grounded shield 20. These positively charged argon ions are attracted to the negatively biased target 14, and may strike the target 14 with sufficient energy to cause target atoms to be sputtered from the target 14. Some of the sputtered atoms strike the wafer 16 and are deposited thereon thereby forming a film of the target material on the wafer 16.

A DC self bias of the wafer 16 results from operation of the RF power supply 32, and enhances efficiency of sputter deposition (e.g., by attracting ionized target atoms which strike the wafer 16 with more directionality). As stated, the use of asymmetric magnetic fields increases ionized metal densities. A larger fraction of sputtered target atoms thereby strike the wafer 16 (with greater directionality).

Within the reactor 10, sputtering typically is performed at a pressure of about 0–2 milliTorr. Other pressures may be employed. The power applied to the target 14 may be, for example, about 18 kW and the RF bias signal applied to the pedestal 18 may be about 250 W or less (although other target powers and RF biases may be used).

If reactive sputtering is to be performed, nitrogen is flowed into the chamber 12 from the second gas supply 25 together with argon provided from the working gas supply 23. Nitrogen reacts with the target 14 to form a nitrogen film on the target 14 so that metal nitride is sputtered therefrom. Additionally, non-nitrided atoms are also sputtered from the target 14. These atoms can combine with nitrogen to form metal nitride in flight or on the wafer 16.

FIG. 1B is a schematic cross-sectional view of a second conventional PVD reactor 10'. The reactor 10' of FIG. 1B may have all of the components described above in connection with the reactor 10 of FIG. 1A. In addition the reactor 10' includes a coil 38 which is disposed within the chamber 12 and surrounds a portion of the interior volume of the chamber 12. The coil 38 may comprise a plurality of coils, a single turn coil, a single turn material strip, or any other similar configuration. The coil 38 is positioned along the inner surface of the chamber 12, between the target 14 and the pedestal 18.

An RF power source 40 is connected to the coil 38 and is controlled by the controller 30. During sputter-deposition operation of the reactor 10', the RF power source 40 is operated to energize the coil 38, to enhance the plasma within the chamber 12 (by ionizing target atoms sputtered from the target 14). The coil 38 typically is energized at about 2 MHz at a power level of 1–3 kW. Other frequencies and/or powers may be used. As with the reactor 10 of FIG. 1A, metal ion densities can reach about $10^{10}$–$10^{11}$ metal ions/cm$^3$. However, because of the energy provided by the coil 38, high metal ion densities may be provided over a wider region of the plasma of the reactor 10 than for the plasma of the reactor 10 of FIG. 1A. The chamber pressures employed in the reactor 10' of FIG. 1B may be similar to those described above in connection with the reactor 10 of FIG. 1A. As was the case with the reactor 10 of FIG. 1A, stationary ring magnets may be used in the reactor 10' of FIG. 1B in place of the rotating magnetron 36.

FIG. 1C is a schematic cross-sectional view of a third conventional PVD reactor 10". The reactor 10" of FIG. 1C may have all the components of the reactor 10' of FIG. 1B, except that in place of the asymmetric magnetron 36 shown in FIG. 1B, a balanced magnetron 42 (FIG. 1C) may be provided. The magnetic field provided by the balanced magnetron 42 does not extend as far into the chamber 12 as the magnetic field provided by the asymmetric magnetron 36. The reactor 10" of FIG. 1C is therefore operated at a higher pressure (e.g., 10–100 milliTorr) so that metal atoms sputtered from the target 14 thermalize and have a greater opportunity for ionization. That is, at the higher pressure at which the reactor 10" operates, metal atoms sputtered from the target 14 experience more collisions (have a smaller mean free path between collisions) and due to increased collisions have more random motion or a longer transit time within the plasma of the reactor 10" and thus more opportunity to ionize. Metal ion densities within the reactor 10" may reach about $10^{10}$–$10^{11}$ metal ions/cm$^3$, but over a larger volume than in the reactor 10 of FIG. 1A.

As in the case of the reactors 10, 10', stationary ring magnets may be employed in the reactor 10" of FIG. 1C.

FIG. 1D is a schematic cross-sectional view of a fourth conventional PVD reactor 10'". The reactor 10'" includes a specially shaped target 242 and a magnetron 280. The target 242 or at least its interior surface is composed of the material to be sputter deposited (e.g., copper, titanium, tantalum, tungsten or other materials). Reactive sputtering of materials like TiN and TaN can be accomplished by using a Ti or Ta target and including gaseous nitrogen in the plasma. In such a case, the nitrogen is introduced into the reactor 10'" from a nitrogen gas source which is not shown in FIG. 1D. Other combinations of metal targets and reactive gases may be employed.

The target 242 includes an annularly shaped downwardly facing vault 118 facing a wafer 120 which is to be sputter coated. The vault could alternatively be characterized as an annular roof. The vault 118 has an aspect ratio of its depth to radial width of at least 1:2 and preferably at least 1:1. The vault 118 has an outer sidewall 122 outside of the periphery of the wafer 120, an inner sidewall 124 overlying the wafer 120, and a generally flat vault top wall or roof 244 (which closes the bottom of the downwardly facing vault 118). The target 242 includes a central portion forming a post 126 including the inner sidewall 124 and a generally planar face 128 in parallel opposition to the wafer 120. A cylindrical central well 136 of the target 242 is formed between opposed portions of the inner target sidewall 124. The target 242 also includes a flange 129 that is vacuum sealed to a grounded chamber body 150 of the reactor 10'" through a dielectric target isolator 152.

The wafer 120 is clamped to a heater pedestal electrode 154 by, for example, a clamp ring 156 although electrostatic chucking may alternatively be employed. An electrically grounded shield 158 acts as an anode with respect to the cathode target 242, which is negatively energized by a power supply 160. As an alternative to DC sputtering, RF sputtering can also be employed, and may be particularly useful for sputtering non-metallic targets.

An electrically floating shield 162 is supported on the electrically grounded shield 158 or chamber 150 by a dielectric shield isolator 164. A cylindrical knob 166 extending downwardly from the outer target sidewall 122 and positioned inwardly of the uppermost part of the floating shield 162 protects the upper portion of the floating shield 162 and the target isolator 152 from sputter deposition from the strong plasma disposed within the target vault 118. The gap between the upper portion of the floating shield 162 and the target knob 166 and the flange 129 is small enough to act as a dark space (preventing a plasma from propagating into the gap).

A working gas such as argon is supplied into the reactor 10'" from a gas source 168 through a mass flow controller 170. A vacuum pumping system 172 maintains the chamber at a reduced pressure, typically a base pressure of about $10^{-8}$ Torr. An RF power supply 174 RF biases the pedestal electrode 154 through an isolation capacitor (not shown), to produce a negative DC self-bias. Alternatively, the RF power supply may be omitted and the pedestal electrode 154 may be allowed to float to develop a negative self-bias. A controller 176 regulates the power supplies 160, 174, mass flow controller 170, and vacuum system 172 (e.g., according to a sputtering recipe stored in the controller 176). The controller 176 also may control the position and/or temperature of the pedestal electrode 154.

The magnetron 280 includes inner and outer top magnets 272, 274 overlying the vault roof 244. Side magnets 282, 284 disposed outside of the vault sidewalls 122, 124 have opposed vertical magnetic polarities but are largely decoupled from the top magnets 272, 274 because they are supported on a magnetic yoke 188 by non-magnetic supports 286, 288. As a result, the side magnets 282, 284 create a magnetic field B in the vault 118 that has two generally anti-parallel components extending radially across the vault 118 as well as two components extending generally parallel to the trough sidewalls. Thus the magnetic field B extends over a substantial depth of the vault 118 and repels electrons from the sidewalls 122, 124. A magnetic field B' is formed by top magnets 272, 274.

A motor 190 is supported on the chamber body 150 by means of a cylindrical sidewall 192 and a roof 194, which are preferably electrically isolated from the biased target flange 129. The motor 190 has a motor shaft connected to the yoke 188 at a central axis 116 of the target 242. The motor 190 may rotate the magnetron 280 about the axis 116 at a suitable rate (e.g., about 50 rpm or greater). The yoke 188 is asymmetric and may be shaped as a sector. Mechanical counterbalancing may be provided to reduce vibration in the rotation of the axially offset magnetron 280.

Some or all of the magnets of the magnetron 280 may be replaced by stationary ring magnets.

The pressure level employed during sputtering in the reactor 10'" of FIG. 1D may be similar to the pressure level employed during sputtering in the reactor 10 of FIG. 1A. The reactor 10'" of FIG. 1D produces ionized metal densities in the range of $10^{10}$–$10^{11}$ metal ions/cm$^3$ without requiring a coil and over a larger volume than in the reactor 10 of FIG. 1A. Target power may be in the range of about 20–40 kW although other power ranges may be employed.

A reactor of the type shown in FIG. 1D is disclosed in U.S. Pat. No. 6,277,249, which is hereby incorporated by reference herein in its entirety. U.S. Pat. No. 6,251,242 is related to U.S. Pat. No. 6,277,249 and is also incorporated by reference herein in its entirety.

The multi-layer structure of typical semiconductor devices requires that connections be made between layers of the devices. For this purpose, holes or other features are formed in dielectric layers that isolate adjacent conductive layers from each other, and the holes are filled with conductive material (e.g., metal). If a lower layer to which a connection is made is the semiconductor substrate, then a connecting hole is referred to as a "contact"; if the lower layer is a metallization layer then the connecting hole is referred to as a "via". As used herein, the term "via" should be understood to include both contact holes and via holes, as well as other similar features such as lines and/or trenches.

With the use of copper for metallization layers in semiconductor devices, it has become conventional to coat vias with barrier layers before filling with copper. The purpose of the barrier layer is to prevent diffusion of the copper into the dielectric layer through which the via or other feature is formed.

FIG. 2 is a schematic cross-sectional view of a dual damascene structure 300 which has been coated with a barrier layer 302 in accordance with conventional practice. It should be understood that FIG. 2 is not drawn to scale and is merely representative. The dual damascene structure 300 has been formed in a dielectric layer 304, and includes a trench 306 and vias 308. The vias 308 have bottoms 310 and side walls 312.

In accordance with conventional practice, the barrier layer 302 may be formed by sputter-depositing a tantalum nitride layer 314, followed by sputter-depositing a tantalum layer 316. According to this conventional practice, the tantalum nitride layer 314 generally is deposited so as to have a thickness of about 100 angstroms at a field region 318 of the substrate. The tantalum layer 316 generally is deposited so as to have a thickness of about 150 angstroms at the field region 318.

A problem which is encountered with the conventional barrier layer 302 of FIG. 2 is asymmetry in the barrier layer, particularly at the lower portion of the via side wall 312 (near bottom 310), as indicated by reference numeral 320. Such asymmetry may result in inadequate side wall coverage and less than desirable performance of the barrier layer 302.

SUMMARY OF THE INVENTION

In a first aspect of the invention, a first method is provided for forming a barrier layer on a substrate. The first method includes the step of sputter-depositing a tantalum nitride layer on a substrate having (1) a metal feature formed on the substrate; (2) a dielectric layer formed over the metal feature; and (3) a via formed in the dielectric layer so as to expose the metal feature. The via has side walls and a bottom, and a width of about 0.18 microns or less. The tantalum nitride layer is deposited on the side walls and bottom of the via and on a field region of the dielectric layer; and has a thickness of at least about 200 angstroms on the field region of the dielectric layer upon completion of the sputter-depositing of the tantalum nitride layer.

The first method also includes the step of sputter-depositing a tantalum layer on the substrate, in the same chamber used to sputter deposit the tantalum nitride layer. The tantalum layer having a thickness of less than about 100 angstroms on the field region of the dielectric layer upon completion of the sputter-depositing of the tantalum layer.

In a second aspect of the invention, a second inventive method is provided for forming a barrier layer on a substrate. The second inventive method is similar to the first inventive method, but includes the step of back sputtering at least a portion of the tantalum nitride layer from the bottom of the via of the substrate prior to the step of sputter-depositing the tantalum layer. Numerous other aspects are provided, as are systems and apparatus in accordance with these and other aspects of the invention.

The inventive methods and apparatus provided herein reflect a recognition on the part of the present inventors that the problem of side wall asymmetry in a conventional barrier layer formed from a tantalum nitride layer and a tantalum layer is largely due to asymmetry in the tantalum layer. Consequently, in one or more aspects of the present invention, the thickness of the tantalum layer is reduced, while increasing the thickness of the tantalum nitride layer. Prior art practices have called for a tantalum nitride layer having a thickness of about 100 angstroms and a tantalum layer having a thickness of at least 100 angstroms on the field region of a substrate. By contrast, aspects the invention provide for a tantalum nitride layer of about 200 angstroms or greater and a tantalum layer of less than about 100 angstroms on the field region of the substrate. In at least one embodiment of the invention, the thickness of the tantalum layer is about 30–50 angstroms on the field region of the substrate. Numerous other aspects are provided.

Other features and aspects of the present invention will become more fully apparent from the following detailed description, the appended claims and the accompanying drawings.

DETAILED DESCRIPTION

In accordance with one or more aspects the invention, a barrier layer is formed in a via that has been formed in a dielectric layer on a substrate. The barrier layer may be formed, for example, employing a three-step process. In the first step, a tantalum nitride layer is sputter-deposited on a bottom, side walls and field region of the via. In the second step, the tantalum nitride layer is back sputtered from the bottom of the via to reduce or eliminate the bottom tantalum nitride layer, and to improve side wall coverage. In the third step, a brief or "flash" sputter-deposition of tantalum is performed to provide suitable wetting for subsequent copper seed layer deposition. Other aspects are provided.

Figure 3:
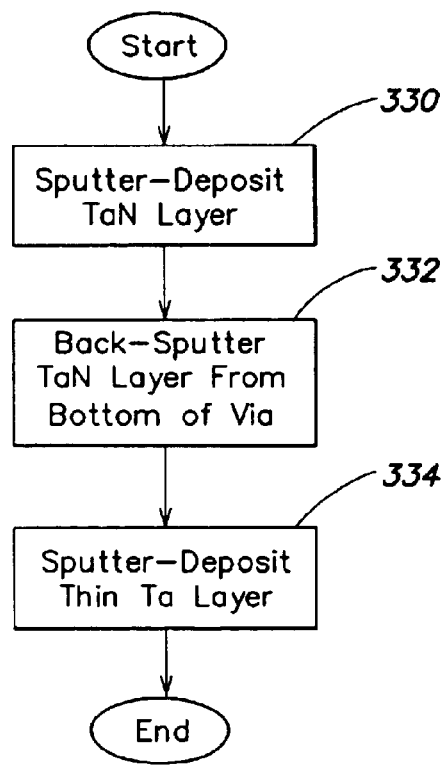
FIG. 3 is a flow chart that illustrates a method of forming a barrier layer on a substrate in accordance with the present invention.

FIG. 3 is a flow chart that illustrates an exemplary process performed in accordance with the present invention. The process of FIG. 3 may be performed, for example, in a sputtering reactor of the type illustrated in FIG. 1B.

The process of FIG. 3 begins with a step 330, at which a tantalum nitride layer is sputter-deposited by a reactive sputtering process. That is, referring to FIG. 1B, the target 14 (a tantalum target) is energized by means of the DC power supply 22. Argon is flowed to the chamber 12 via the mass flow controller 26, and nitrogen is flowed to the chamber 12 via the mass flow controller 29. In one embodiment of the invention, the chamber pressure may be about 10 mTorr or less, and more preferably in the range of about 2–4 mTorr. Other pressures may be employed. If the reactor 10' is adapted to process 200 millimeter substrates, the power signal supplied to the target 14 by the DC power supply 22 may be about 20 kW (or less), and a bias signal in the range 0–150 W may be supplied to the pedestal 18 by the RF power supply 32. If the reactor 10' is adapted to process 300 millimeter substrates, the target power may be about 40 kW (or less) and the bias power may be in the range of about 0–300 W. Other power ranges may be employed. In at least one embodiment of the invention, the coil 38 is not energized during step 330.

The energized target 14 ignites the gases in the chamber 12 to form a plasma so that tantalum nitride is reactively sputter-deposited on the substrate 16. In one particular embodiment, step 330 may have a duration in the range of about 7–10 seconds (although other durations may be employed).

Figure 2:
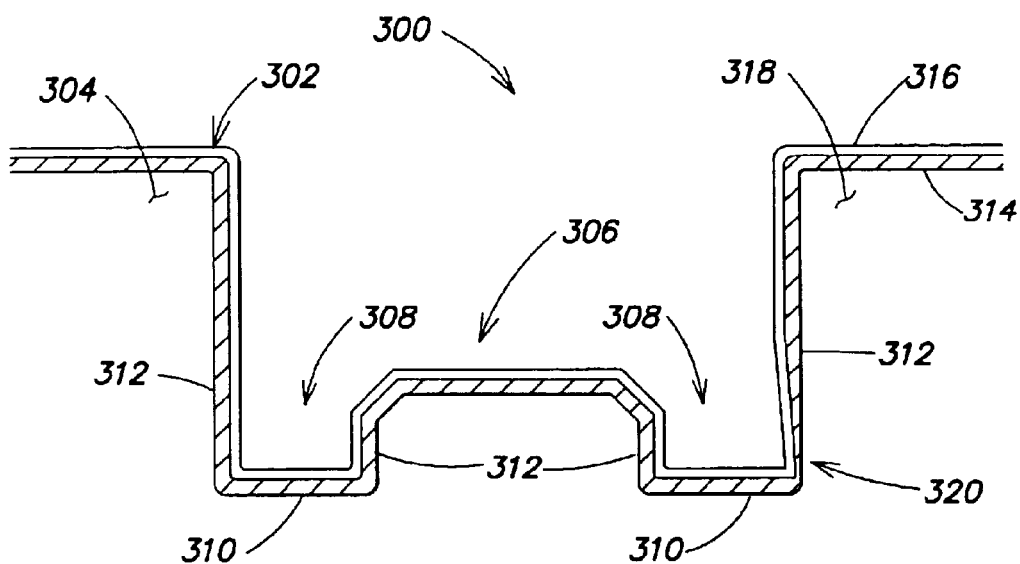
FIG. 2 is a schematic cross-sectional view of a dual damascene structure that has been coated with a barrier layer in accordance with a conventional process.
Figure 4A:
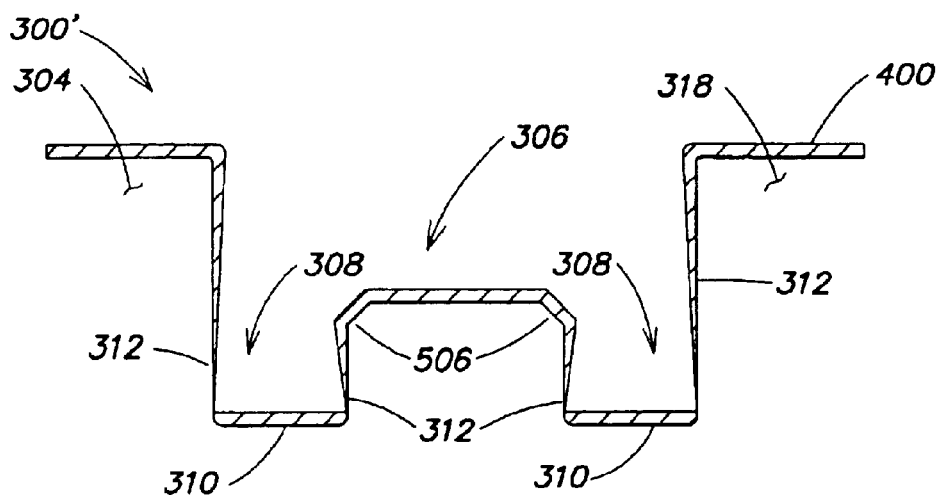
FIGS. 4A–4C are schematic cross-sectional views of a dual damascene structure at various stages of the inventive process of FIG. 3.

FIG. 4A is a schematic cross-sectional view showing a dual damascene structure 300' upon completion of step 330. Reference numeral 400 indicates a tantalum nitride layer deposited during step 330. FIG. 4A shows the same dielectric layer 304, trench 306, vias 308, via bottoms 310, via side walls 312 and field region 318 as were referred to in connection with FIG. 2. Like FIG. 2 (and also FIGS. 4B–4D), FIG. 4A is not drawn to scale. In one or more embodiments of the invention, upon completion of step 330, the tantalum nitride layer 400 may have a thickness on the field region 318 of greater than about 200 angstroms, and preferably about 220 angstroms. Thicknesses in the range of about 100–400 angstroms may also be employed.

Referring again to FIG. 3, step 330 is followed by step 332. At step 332 the tantalum layer 400 is at least partially back sputtered from the via bottoms 310. In one embodiment of the invention, substantially all of the tantalum nitride layer 400 is back sputtered from the via bottoms 310. In step 332, argon is flowed to the chamber 12 via the mass flow controller 26, but nitrogen is not flowed to the chamber 12. In one or more embodiments of the invention, the pressure in the chamber 12 may be, for example, less than about 10 mTorr and more preferably in the range of about 1–3 mTorr. A bias signal is supplied to the pedestal 18 by the RF power supply 32. If the reactor 10' is adapted to process 200 millimeter wafers, the bias signal may be, for example, in the range of about 200–500 W, and in one embodiment may be about 300 W. If the reactor 10' is adapted to process 300 millimeter substrates, the bias signal may be, for example, in the range of about 400–1000 W. In addition, the coil 38 may be energized by the RF power source 40 (e.g., at about 2 MHz), for example, at a power level in the range of about 1000–3000 W. In addition, the target 14 may be energized with a power level in the range of about 0–1000 W. A plasma which is ignited in the chamber 12 causes back sputtering of the tantalum nitride layer 400 from the via bottom walls 310. Depending on the power levels employed, the duration of the back sputtering step 332 may be in the range of about 5–15 seconds. Other chamber pressures, pedestal biases, coil powers, target powers and/or back sputter durations may be employed.

Figure 4B:
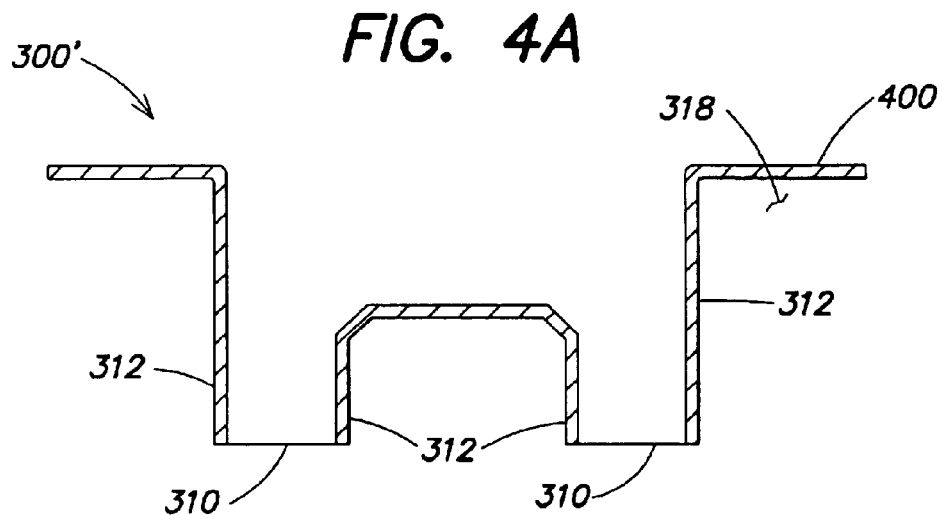

FIG. 4B is a view similar to FIG. 4A, showing the condition of the dual damascene structure 300' upon completion of step 332. As shown in FIG. 4B, the via bottoms 310 may be substantially free of the tantalum nitride layer 400 upon completion of step 332. In addition, coverage/uniformity of the via side walls 312 with tantalum nitride may be improved. In one embodiment, the thickness of the tantalum nitride layer 400 at the field region 318 may be reduced from about 220 angstroms to about 200 angstroms upon completion of step 332. More generally, the back sputtering step may (1) substantially eliminate the tantalum nitride layer on the bottoms 310 of the vias 308 (thereby improving the contact resistance of any interconnect formed therein); (2) increase the thickness and/or uniformity of the tantalum nitride layer on the side walls 312 of the vias 308 (thereby improving the diffusion resistance of the tantalum nitride barrier layer); and/or (3) only slightly thin the tantalum nitride layer on the field region 318 (thereby maintaining adequate diffusion resistance for the dielectric layer 304).

Referring again to FIG. 3, step 334 follows step 332. At step 334 a brief (so-called "flash") sputter-deposition of a tantalum layer is performed. During step 334, argon is flowed to the chamber 12 via the mass flow controller 26, but nitrogen is not flowed to the chamber 12. The pressure in the chamber 12 during step 334 may be, for example, less than about 10 mTorr and more preferably in the range of about 1–3 mTorr. The coil 38 need not be energized during step 334, and the target and bias power levels may be similar to those described in connection with step 330. The duration of step 334 may be less than about two seconds, and, in one embodiment, may be in the range of about 1–1.5 seconds. Thus, during step 334, the target 14 is energized and a plasma is ignited in the chamber 12 to perform sputter-deposition of a tantalum layer on the dual damascene structure 300'. Other chamber pressures, pedestal biases, coil powers, target powers and/or durations may be employed.

Figure 4C:
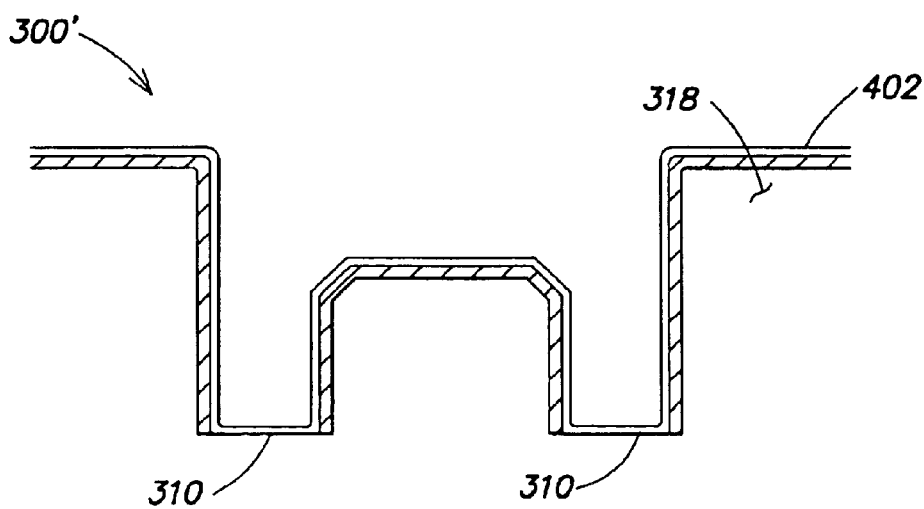

FIG. 4C illustrates the dual damascene structure 300' upon completion of step 334. Reference numeral 402 indicates the tantalum layer deposited during step 334. It should again be noted that FIG. 4C is not drawn to scale. In one particular embodiment of the invention, the tantalum layer 402 may have, upon completion of step 334, a thickness in the range of about 30–50 angstroms on the field region 318. The thickness of the tantalum layer 402 on the via bottom walls 310 may be in the range of about 20–40 50 angstroms. The side-wall coverage may be about 10 angstroms. Other thicknesses may be employed. Also the target power during step 334 may be less than indicated above (e.g., the target power may be about 5 kW or less) in which case the step 334 may have a longer duration.

It will be appreciated that the controller 30 (FIG. 1B) may be programmed to perform one or more of the steps of the process of FIG. 3 within the reactor 10'.

Figure 1A:
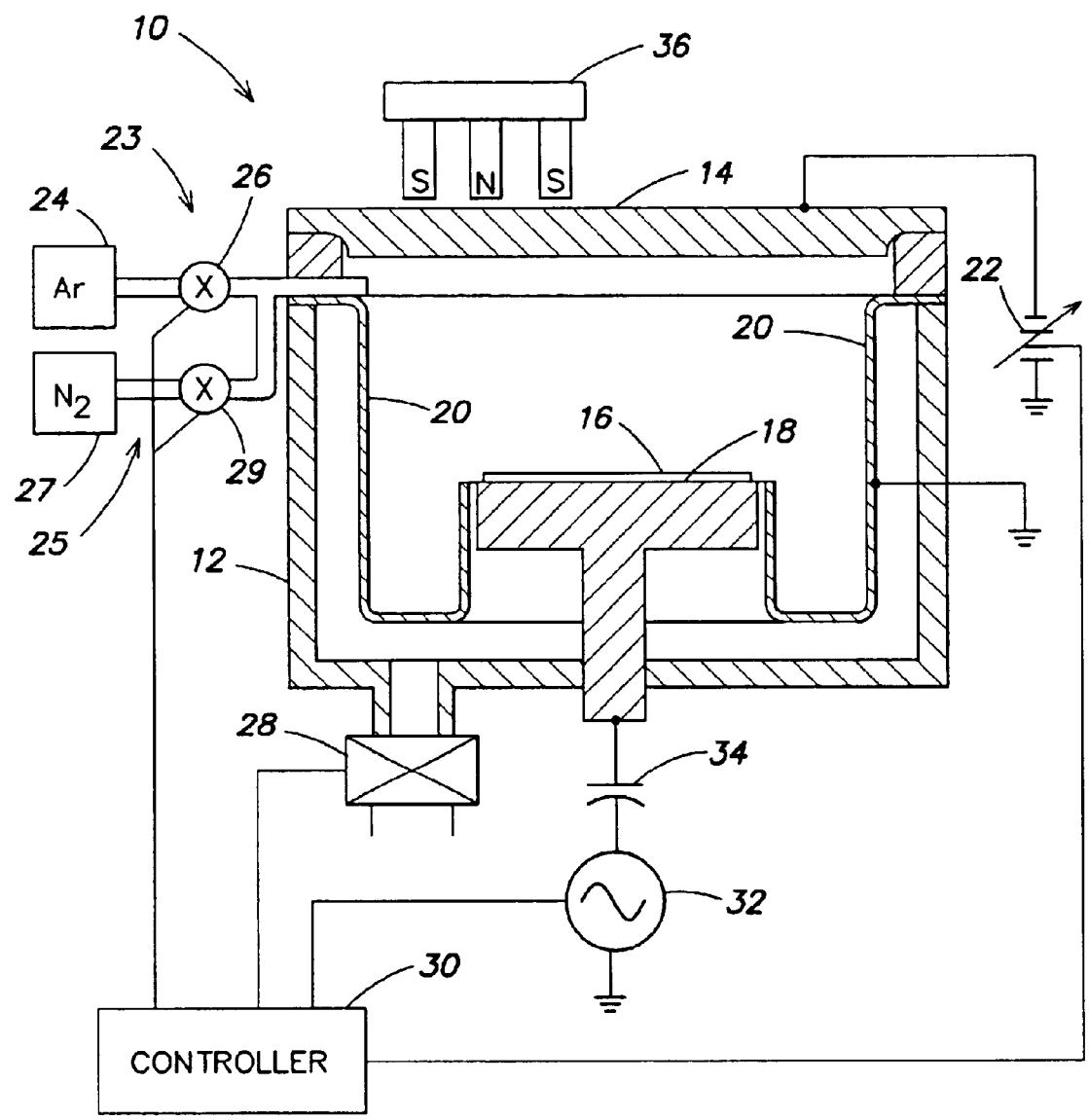
FIG. 1A is a schematic cross-sectional view of a first conventional plasma sputtering reactor.
Figure 1B:
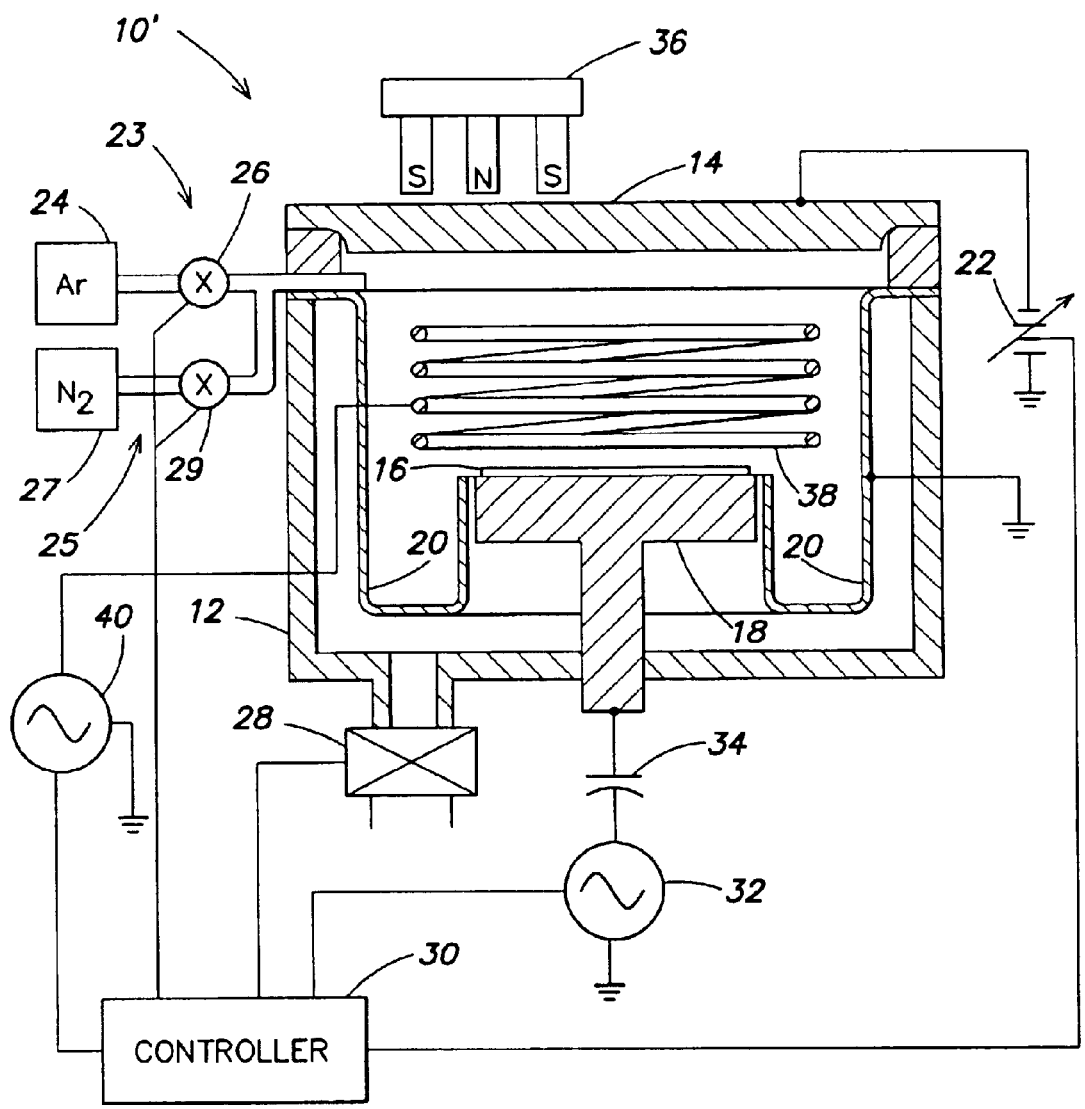
FIG. 1B is a schematic cross-sectional view of a second conventional plasma sputtering reactor.
Figure 1C:
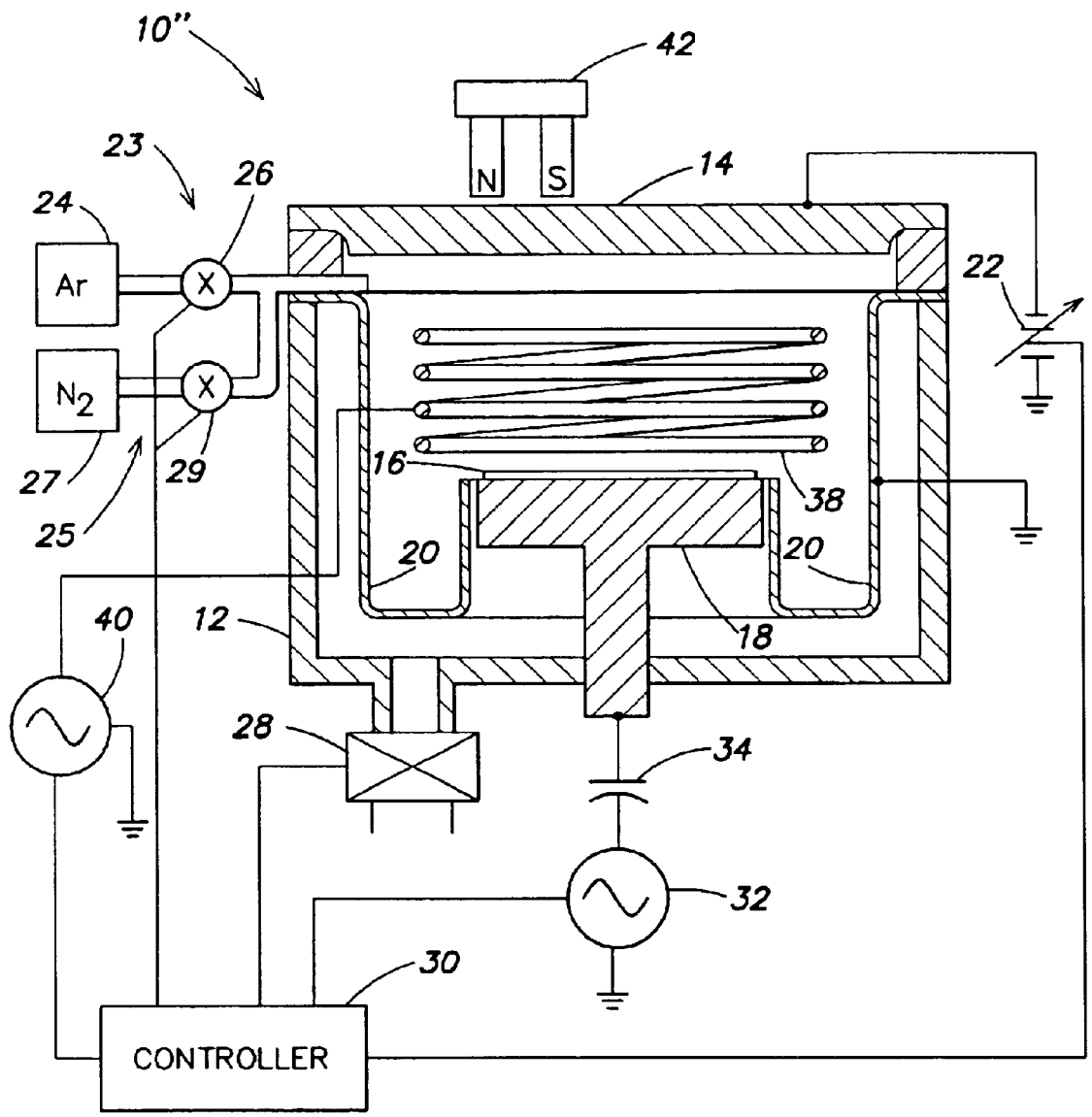
FIG. 1C is a schematic cross-sectional view of a third conventional plasma sputtering reactor.
Figure 1D:
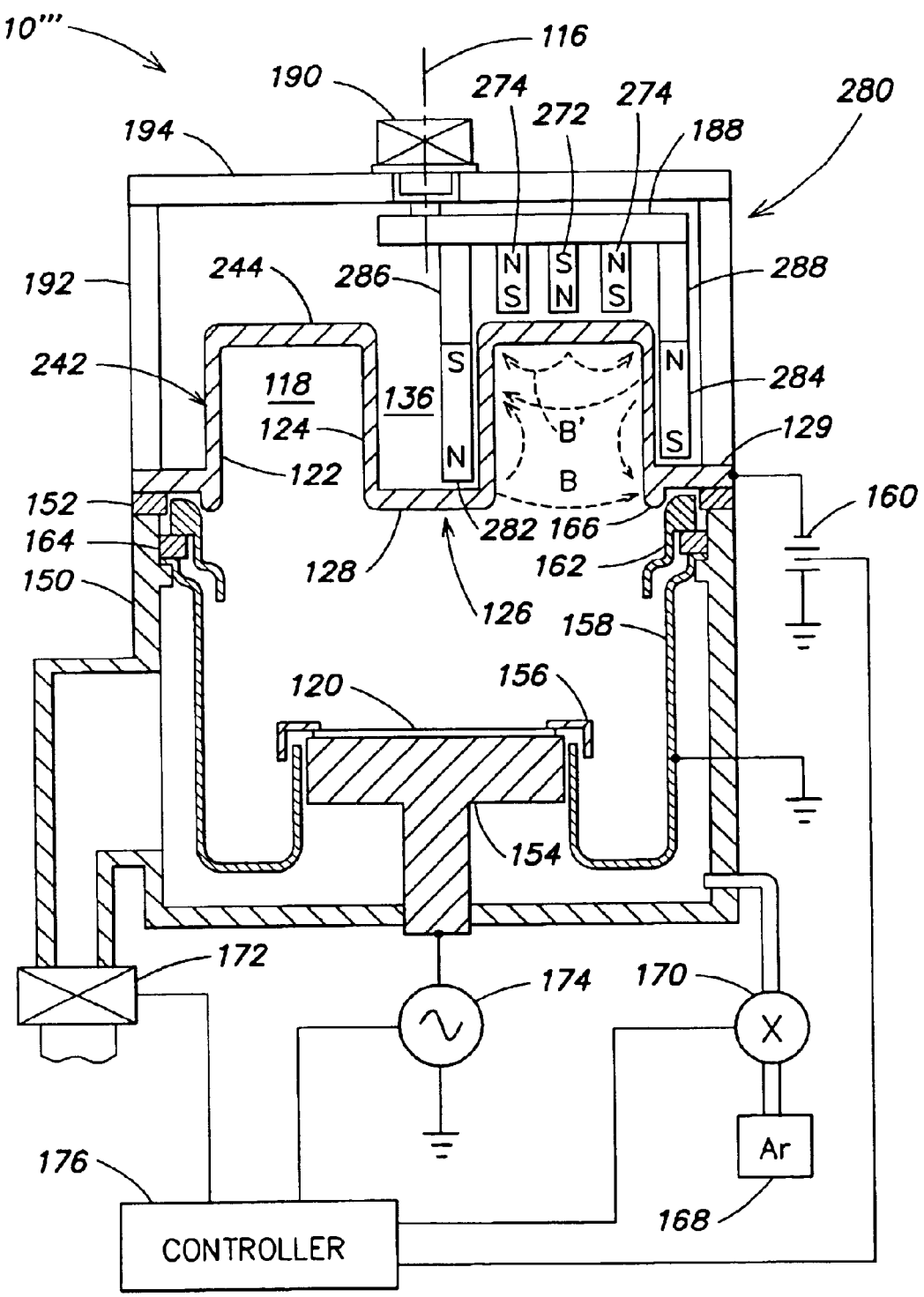
FIG. 1D is a schematic cross-sectional view of a fourth conventional plasma sputtering reactor.

While the present invention has been described as applied in a plasma sputtering reactor of the type illustrated in FIG. 1B, it will be understood that the present invention may be applied in other types of plasma sputtering reactors, including those illustrated in FIGS. 1A, 1C and 1D. However, the reactor of FIG. 1B is believed to be particularly advantageous in view of the back sputtering efficiency promoted by energizing the coil 38.

Figure 4D:
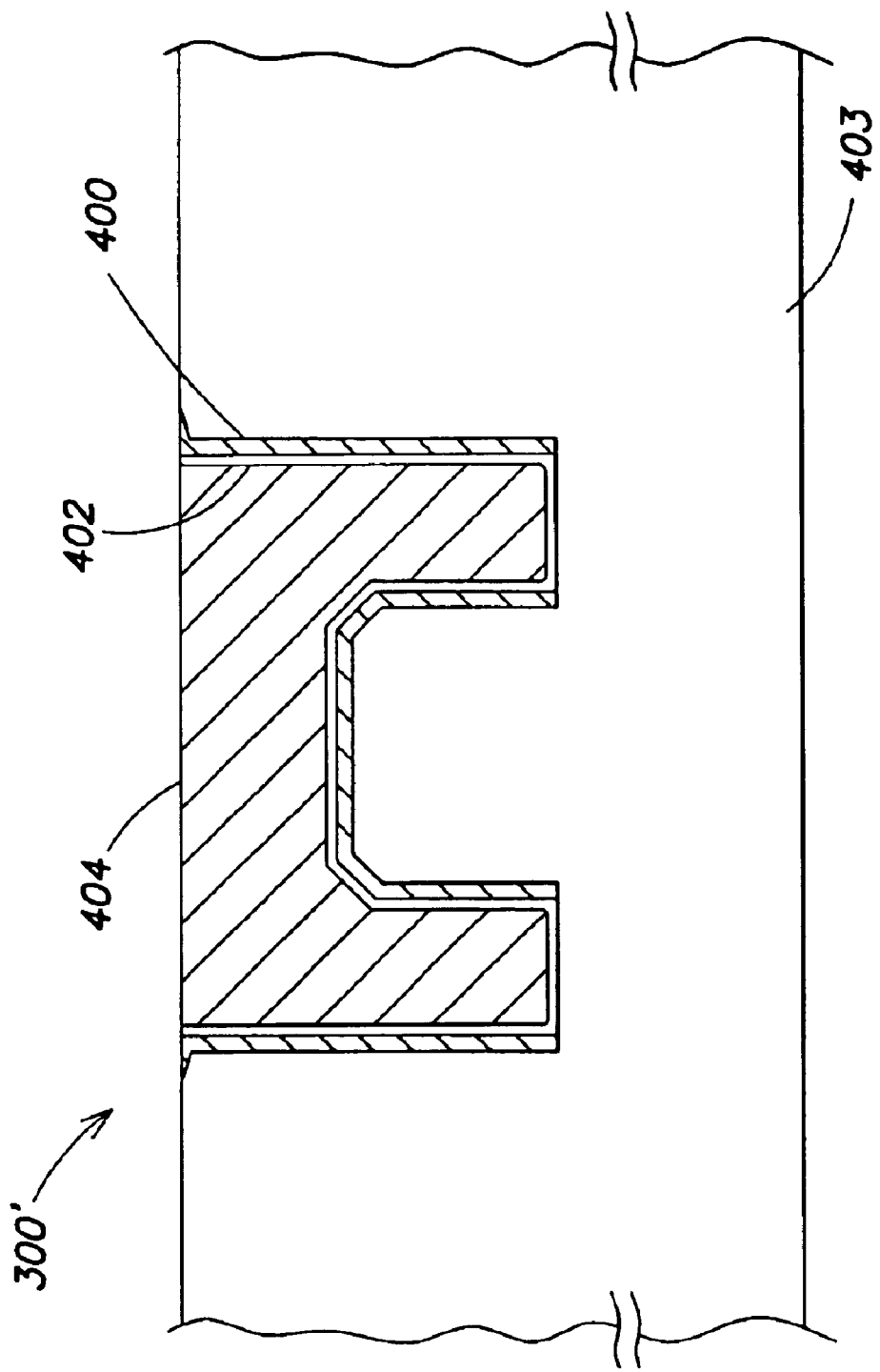
FIG. 4D is a view similar to FIGS. 4A–4C showing the dual damascene structure after copper-filling subsequent to the process of FIG. 3.

FIG. 4D is a view similar to FIG. 4A, showing the dual damascene structure 300' upon completion of copper fill and planarization processes that may be performed after the process of FIG. 3. In accordance with conventional practices, the filling of the dual damascene structure 300' with copper may include sputter-deposition of a copper seed layer on the substrate 403 (e.g., in a different reactor than that employed for tantalum nitride and tantalum deposition), followed by copper electrochemical deposition (e.g., electrochemical plating). In FIG. 4D, reference numeral 404 indicates the copper fill of the dual damascene structure 300' after formation of a barrier layer that includes the tantalum nitride layer 400 and the tantalum layer 402.

The present invention also may provide a fourth step for the process of FIG. 3, in which back sputtering is performed with respect to the tantalum layer 402 (e.g., to further reduce interconnect resistance). However, it may be advantageous to omit back sputtering of the tantalum layer, so that there is adequate wetting of the via bottoms 310.

The thicknesses of the tantalum nitride layer 400 and the tantalum layer 402 on the field region 318 as described (e.g., about 200 angstroms of tantalum nitride after back sputtering and about 30–50 angstroms of tantalum) may be suitable in conjunction with a 0.13 micron generation of semiconductor devices, in which a typical via width may be about 0.18 microns, and a typical aspect ratio of a via may be in the range of about 4:1 to 6:1. In general however, the thickness of the tantalum nitride layer on the field region, either before or after back sputtering, may be in the range of about 100–400 angstroms, and the thickness of the tantalum layer on the field region may be any thickness less than about 100 angstroms. It is also contemplated to employ the tantalum nitride and tantalum layer thicknesses according to the present invention in connection with via widths that are less than 0.18 microns.

The inventive methods and apparatus disclosed herein provide for satisfactory barrier layer side wall coverage with reduced asymmetry, together with suitable wetting for subsequent deposition of a copper seed layer.

The foregoing description discloses only exemplary embodiments of the invention; modifications of the above-disclosed apparatus and methods which fall within the scope of the invention will be readily apparent to those or ordinary skill in the art.

For instance, one or more of the steps of the process of FIG. 3 may be implemented in computer program code as one or more computer program products. Each inventive computer program product may be carried by a medium readable by a computer (e.g., a carrier wave signal, a floppy disk, a hard drive, a random access memory, etc.). Such computer program code and/or computer program products may be executed, for example, by one or more of the controllers 30, 176 of FIGS. 1A–1D.

It may be desirable to control (via the controllers 30, 176 of FIGS. 1A–1D) the temperature of a substrate during back sputtering (e.g., to prevent excessive heating during back sputtering). This may be achieved, for example, via control of a resistive heating element (not shown) and/or a liquid cooling system (not shown) associated with the pedestal 18, 154.

It is contemplated to modify the process of FIG. 3 by omitting the back sputtering step 332 performed between the sputter-deposition steps 330, 334 and instead back sputtering one or both of the tantalum layer 402 and the tantalum nitride layer 400 after the sputter-deposition of the tantalum layer 402 at step 334.

As another alternative for modifying the process of FIG. 3, a step of sputter-depositing an initial tantalum layer (e.g., with a field region thickness of 100 angstroms or more) is performed after step 330 and before step 332. At step 332, substantially all of the resulting tantalum and tantalum nitride layers may be removed from the via bottoms. Step 334 is then performed as described above.

For example, FIGS. 5A–5D are cross-sectional views of a dual damascene structure 300" at various stages of such an alternate process. For clarity purposes, no asymmetry in layer thickness is shown in FIGS. 5A–5D.

Figure 5A:
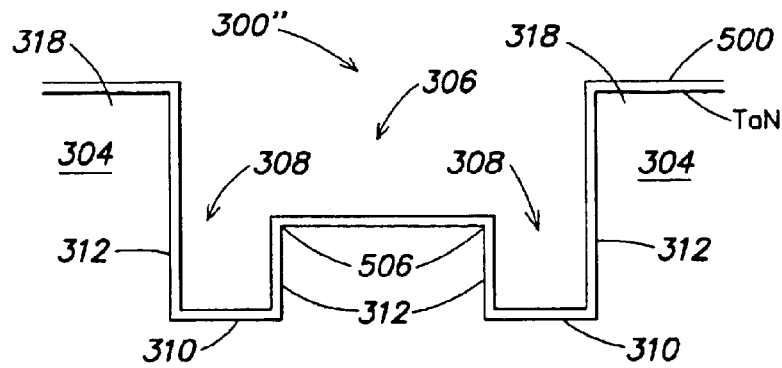
FIGS. 5A–5D are schematic cross-sectional views of a dual damascene structure at various stages of an alternate inventive barrier layer process.
Figure 5B:
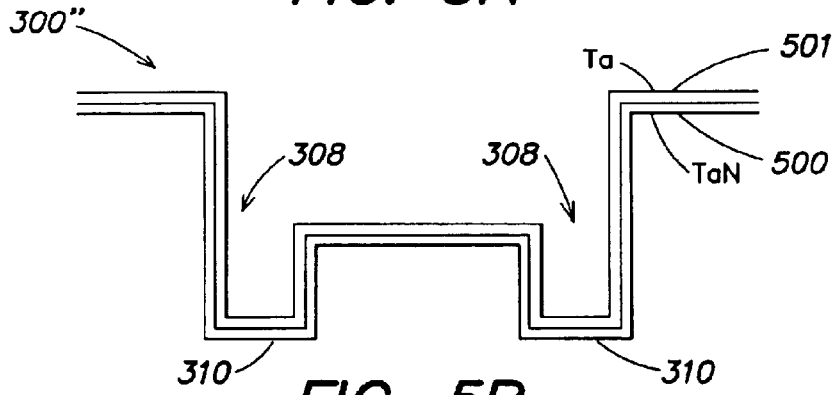
Figure 5C:
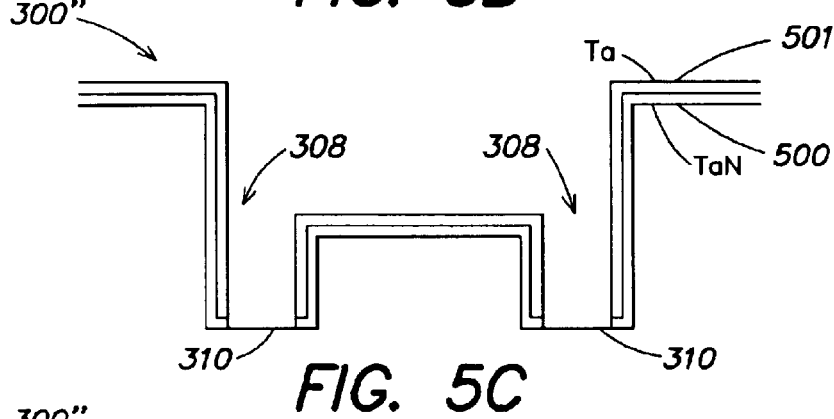
Figure 5D:
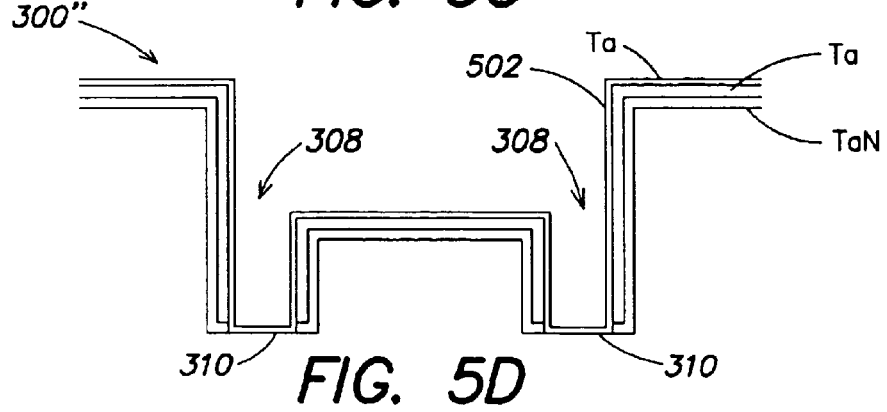

With reference to FIG. 5A and FIG. 3, a tantalum nitride layer 500 is deposited on the bottoms 310 and side walls 312 of the vias 308 (Step 330, FIG. 3). An initial tantalum layer 501 (FIG. 5B) then is deposited over the tantalum nitride layer 500 (step not shown in FIG. 3). Thereafter, both the tantalum layer 501 and the tantalum nitride layer 500 are back sputtered from the bottoms 310 of the vias 308 (thereby improving barrier layer coverage on the side walls 312), as shown in FIG. 5C (and/or Step 332 of FIG. 3). A thin tantalum flash layer 502 then may be formed over the bottom and/or side walls of the vias 308 (FIG. 5D and/or Step 334 in FIG. 3). The dual damascene structure 300" then may be filled and/or planarized as previously described (e.g., via use of a copper seed layer and/or electrochemical deposition).

In at least one embodiment of the invention, when the inventive alternative process described above is employed with vias having widths of about 0.18 microns or less, the tantalum nitride layer 500 may have a thickness of about 50–100 angstroms on the field region 318 of the dielectric layer 304, a thickness of about 10–20 angstroms on the side walls 312 of the vias 308 and a thickness of about 10–70 angstroms on the bottoms 310 of the vias 308. The initial tantalum layer 501 may have a thickness of about 100–300 angstroms on the field region 318 of the dielectric layer 304, a thickness of about 20–40 angstroms on the side walls 312 of the vias 308 and a thickness of about 30–180 angstroms on the bottoms 310 of the vias 308. Following back sputtering of the tantalum nitride and tantalum layers 500, 501, the total barrier layer thickness on the side walls 312 may be about 50 Å or more (and may include a tantalum nitride/tantalum/tantalum nitride stack). The tantalum flash layer 502 may add a thickness of about 50–100 angstroms (of tantalum) on the field region 318, a thickness of about 5–15 angstroms on the side walls 312 and a thickness of about 15–50 angstroms on the bottoms 310. Note that the tantalum flash layer 502 is optional, and if employed, may result in side walls 312 having barrier layers of tantalum nitride/tantalum/tantalum nitride/tantalum. Other thicknesses may be employed for the tantalum and tantalum nitride layers.

When back sputtering the tantalum nitride and/or tantalum layers in accordance with the present invention, it may be preferable to maintain a significant neutral metal density (e.g., by sputtering target atoms during back sputtering) and ion density (e.g., by applying power to an RF coil or by employing any other known means for increasing ion density) during back sputtering. Maintaining a significant neutral metal density during back sputtering may reduce and/or prevent over etching of bevel regions 506 (FIGS. 4A and 5A) of the dual damascene structure 300" through deposition of new tantalum and/or tantalum nitride on bevel surfaces during back sputtering. Neutral metal atoms may not, in general, reach the bottoms 310 of the vias 308. A significant ion density (whether metal or argon) will aid in back sputtering of material from the bottoms 310 of the vias 308 by increasing the directionality of the back sputter process.

While the present invention has been described primarily with reference to dual damascene structures, it will be understood that the invention may be applied to other interconnect configurations such as single or triple damascene structures.

As used herein, a high density plasma physical vapor deposition (HDPPVD) chamber may include any PVD chamber capable of sustaining a plasma having an ion density of at least $10^{10}$ ions/cm$^3$ in a bulk region of the plasma (e.g., a region, between a target/cathode and substrate support pedestal, that is not immediately adjacent the target/cathode; although an area immediately adjacent the target/cathode also may have an ion density of at least $10^{10}$ ions/cm$^3$)

Accordingly, while the present invention has been disclosed in connection with exemplary embodiments thereof, it should be understood that other embodiments may fall within the spirit and scope of the invention, as defined by the following claims.

The invention claimed is:

1. A method of forming a barrier layer on a substrate, comprising:
   sputter-depositing a tantalum nitride layer on a substrate having:
      a metal feature formed on the substrate;
      a dielectric layer formed over the metal feature; and
      a via formed in the dielectric layer so as to expose the metal feature, the via having side walls and a bottom, and a width of about 0.18 microns or less;
      wherein the tantalum nitride layer is deposited on the side walls and bottom of the via and on a field region of the dielectric layer; and
      wherein the tantalum nitride layer has a thickness of at least about 200 angstroms on the field region of the dielectric layer upon completion of the sputter-depositing of the tantalum nitride layer, then back sputtering at least a portion of the tantalum nitride layer from the bottom of the via of the substrate; and
   sputter-depositing a tantalum layer on the substrate, the tantalum layer having a thickness of less than about 100 angstroms on the field region of the dielectric layer upon completion of the sputter-depositing of the tantalum layer;
   wherein sputter-depositing the tantalum nitride layer and sputter-depositing the tantalum layer are performed in a single chamber.

2. The method of claim 1, wherein the tantalum layer has a thickness of less than about 80 angstroms on the field region of the dielectric layer upon completion of the sputter-depositing of the tantalum layer.

3. The method of claim 2, wherein the tantalum layer has a thickness of about 30–50 angstroms on the field region of the dielectric layer upon completion of the sputter-depositing of the tantalum layer.

4. The method of claim 3, further comprising:
   prior to the step of sputter-depositing the tantalum layer, back sputtering at least a portion of the tantalum nitride layer from the bottom of the via of the substrate.

5. The method of claim 4, wherein the back sputtering step includes removing substantially all of the tantalum nitride layer from the bottom of the via.

6. The method of claim 5, wherein the tantalum nitride layer has a thickness of about 200 angstroms or more on the field region of the dielectric layer after the back sputtering step.

7. The method of claim 6, wherein the step of sputter-depositing the tantalum nitride layer has a duration of not more than about 10 seconds.

8. The method of claim 6, wherein the back sputtering step has a duration of not more than about 15 seconds.

9. The method of claim 6, wherein the step of sputter-depositing the tantalum layer has a duration of not more than about 2 seconds.

10. The method of claim 9, wherein the step of sputter-depositing the tantalum layer has a duration of about 1 to 1.5 seconds.

11. The method of claim 2, further comprising:
    prior to the step of sputter-depositing the tantalum layer, back sputtering at least a portion of the tantalum nitride layer from the bottom of the via of the substrate.

12. The method of claim 1, further comprising:
    prior to the step of sputter-depositing the tantalum layer, back sputtering at least a portion of the tantalum nitride layer from the bottom of the via of the substrate.

13. The method of claim 12 wherein sputter-depositing the tantalum nitride layer, back sputtering at least a portion of the tantalum nitride layer and sputter-depositing the tantalum layer are performed in a single deposition chamber.

14. A method of forming a barrier layer on a substrate, comprising:
    sputter-depositing a tantalum nitride layer on a substrate having:
       a metal feature formed on the substrate;
       a dielectric layer formed over the metal feature; and
       a via formed in the dielectric layer so as to expose the metal feature, the via having side walls and a bottom, and a width of about 0.18 microns or less;
       wherein the tantalum nitride layer is deposited on the side walls and bottom of the via and on a field region of the dielectric layer; and
       wherein the tantalum nitride layer has a thickness of at least about 200 angstroms on the field region of the dielectric layer upon completion of the sputter-depositing of the tantalum nitride layer; and
    back sputtering at least a portion of the tantalum nitride layer from the bottom of the via of the substrate; and
    after the back sputtering step, sputter-depositing a tantalum layer on the substrate, the tantalum layer having a thickness of less than about 100 angstroms on the field region of the dielectric layer upon completion of the sputter-depositing of the tantalum layer;
    wherein sputter-depositing the tantalum nitride layer, back sputtering at least a portion of the tantalum nitride layer and sputter-depositing the tantalum layer are performed in a single deposition chamber.

15. The method of claim 14, wherein the tantalum layer has a thickness of less than about 80 angstroms on the field region of the dielectric layer upon completion of the sputter-depositing of the tantalum layer.

16. The method of claim 15, wherein the tantalum layer has a thickness of about 30–50 angstroms on the field region of the dielectric layer upon completion of the sputter-depositing of the tantalum layer.

17. The method of claim 14, further comprising:
    prior to the back sputtering step, sputter-depositing an initial tantalum layer on the substrate;
    wherein the back sputtering step includes back sputtering at least a portion of the initial tantalum layer deposited prior to the back sputtering step.

18. The method of claim 14, wherein the back sputtering step includes removing substantially all of the tantalum nitride layer from the bottom of the via.

19. The method of claim 18, wherein the tantalum nitride layer has a thickness of about 200 angstroms or more on the field region of the dielectric layer after the back sputtering step.

20. A method of forming a barrier layer on a substrate, comprising:

sputter depositing a tantalum nitride layer on the substrate having:
- a metal feature formed on the substrate;
- a dielectric layer formed over the metal feature; and
- a via formed in the dielectric layer so as to expose the metal feature, the via having side walls and a bottom, and a width of about 0.18 microns or less;

wherein the tantalum nitride layer is deposited on the side walls and bottom of the via and on a field region of the dielectric layer;

wherein the tantalum nitride layer has a thickness of at least about 200 angstroms on the field region of the dielectric layer upon completion of the sputter-depositing of the tantalum nitride layer; and wherein the sputter depositing of the tantalum nitride layer is performed within a high density plasma physical vapor deposition (HDPPVD) chamber employing a plasma having an ion density of at least $10^{10}$ ions/cm$^3$, at a pressure of not more than about 10 mTorr using a target power of not more than about 40 kW and a pedestal bias power of not more than about 300 W;

back sputtering at least a portion of the tantalum nitride layer from a bottom of the via of the substrate within the HDPPVD chamber at a pressure of not more than about 10 mTorr using a target power of not more than about 1000 W, and a pedestal bias power of not more than about 1000 W; and sputter-depositing a tantalum layer on the substrate at a pressure of not more than about 10 mTorr using a target power of not more than about 40 kW and a pedestal bias power of not more than about 300 W.

* * * * *